(12) United States Patent
Ramaswamy et al.

(10) Patent No.: US 9,419,220 B2
(45) Date of Patent: Aug. 16, 2016

(54) RESISTIVE MEMORY ELEMENTS, RESISTIVE MEMORY CELLS, AND RESISTIVE MEMORY DEVICES

(71) Applicant: Micron Technology, Inc., Boise, ID (US)

(72) Inventors: D. V. Nirmal Ramaswamy, Boise, ID (US); Sanh D. Tang, Kuna, ID (US); Alessandro Torsi, Boise, ID (US); Muralikrishnan Balakrishnan, Boise, ID (US); Xiaonan Chen, Boise, ID (US); John K. Zahurak, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/806,259

(22) Filed: Jul. 22, 2015

(65) Prior Publication Data
US 2015/0333257 A1 Nov. 19, 2015

Related U.S. Application Data

(62) Division of application No. 13/523,356, filed on Jun. 14, 2012, now Pat. No. 9,112,138.

(51) Int. Cl.
*H01L 45/00* (2006.01)
*H01L 21/02* (2006.01)

(52) U.S. Cl.
CPC .............. *H01L 45/146* (2013.01); *H01L 45/08* (2013.01); *H01L 45/1233* (2013.01); *H01L 45/1253* (2013.01); *H01L 45/145* (2013.01); *H01L 45/1641* (2013.01)

(58) Field of Classification Search
None
See application file for complete search history.

(56) References Cited

U.S. PATENT DOCUMENTS

| | | | |
|---|---|---|---|
| 6,631,069 B2 | 10/2003 | Yang et al. | |
| 7,297,975 B2 | 11/2007 | Ufert | |
| 7,372,065 B2 | 5/2008 | Kozicki et al. | |
| 7,601,404 B2 | 10/2009 | Yen et al. | |
| 7,741,669 B2 | 6/2010 | Baek et al. | |
| 7,750,336 B2 | 7/2010 | Lee et al. | |
| 7,835,173 B2 | 11/2010 | Ma et al. | |
| 7,884,345 B2 | 2/2011 | Peng et al. | |
| 9,112,138 B2 * | 8/2015 | Ramaswamy | H01L 45/08 |
| 2005/0012119 A1 | 1/2005 | Herner et al. | |
| 2005/0074978 A1 | 4/2005 | Wang et al. | |
| 2007/0218623 A1 | 9/2007 | Chua et al. | |
| 2009/0014710 A1 | 1/2009 | Kawashima et al. | |
| 2009/0321809 A1 | 12/2009 | Ramaswamy et al. | |
| 2010/0072449 A1 | 3/2010 | Hsieh et al. | |
| 2010/0080038 A1 | 4/2010 | Awaya et al. | |
| 2011/0007544 A1 | 1/2011 | Vaithyanathan et al. | |
| 2011/0140067 A1 | 6/2011 | Chen et al. | |
| 2011/0227024 A1 | 9/2011 | Sekar et al. | |
| 2011/0227026 A1 | 9/2011 | Sekar et al. | |
| 2012/0001144 A1 | 1/2012 | Greeley et al. | |
| 2013/0334483 A1 | 12/2013 | Ramaswamy et al. | |

* cited by examiner

*Primary Examiner* — Seahvosh Nikmanesh
(74) *Attorney, Agent, or Firm* — TraskBritt

(57) ABSTRACT

A method of forming a resistive memory element comprises forming an oxide material over a first electrode. The oxide material is exposed to a plasma process to form a treated oxide material. A second electrode is formed on the treated oxide material. Additional methods of forming a resistive memory element, as well as related resistive memory elements, resistive memory cells, and resistive memory devices are also described.

20 Claims, 6 Drawing Sheets

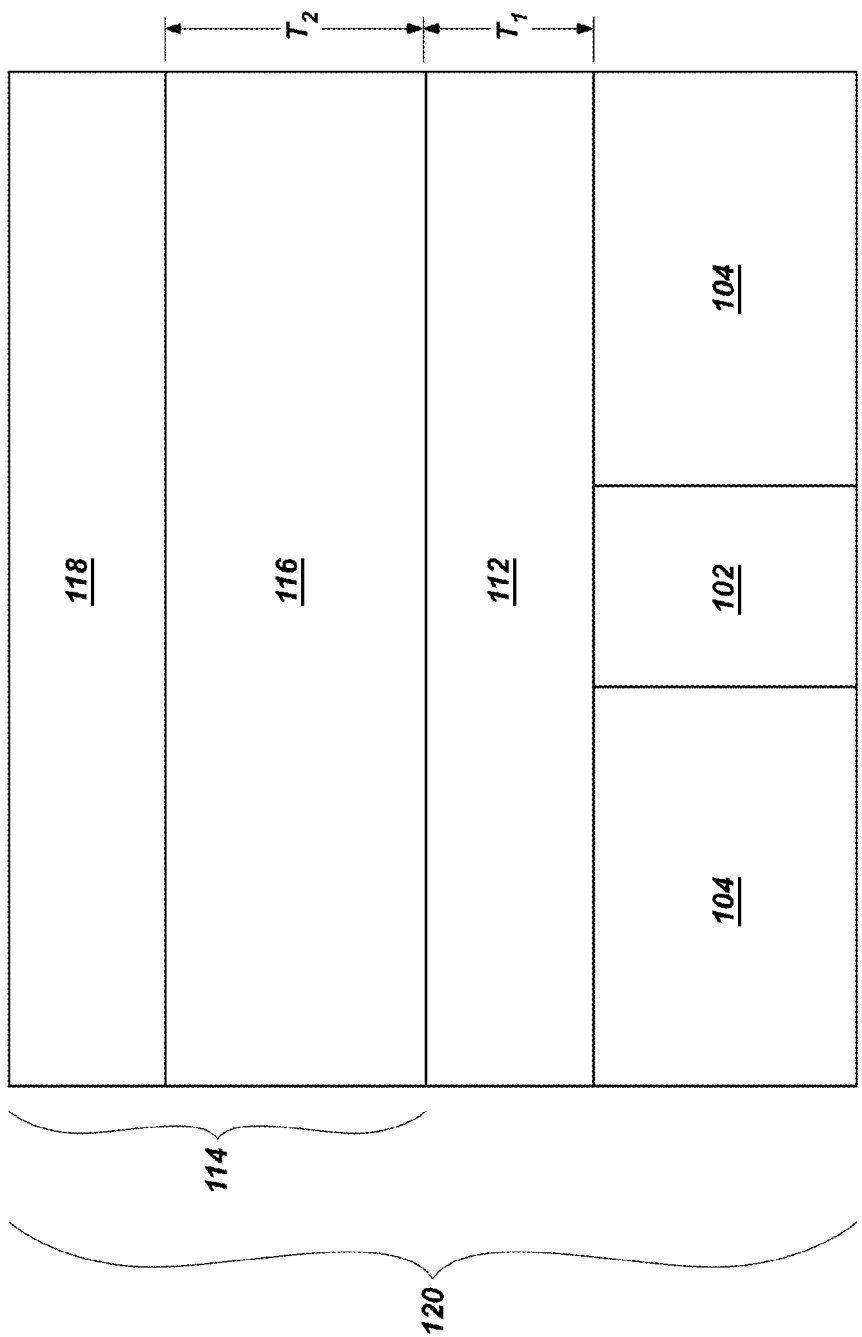

RESISTIVE MEMORY ELEMENTS, RESISTIVE MEMORY CELLS, AND RESISTIVE MEMORY DEVICES

CROSS-REFERENCE TO RELATED APPLICATION

This application is a divisional of U.S. patent application Ser. No. 13/523,356, filed Jun. 14, 2012, now U.S. Pat. No. 9,112,138, issued Aug. 18, 2015, the disclosure of which is hereby incorporated herein in its entirety by this reference.

TECHNICAL FIELD

Embodiments of the present disclosure relate generally to methods of forming resistive memory elements for resistive memory cells. More specifically, embodiments of the present disclosure relate to methods of forming resistive memory elements using plasma treatment processes, such as a plasma nitridation process, and to related resistive memory elements, resistive memory cells, and resistive memory devices.

BACKGROUND

Non-volatile resistive memory devices are an important element of integrated circuit devices due to their ability to store data absent a power supply. Resistive memory cells, such as resistive random access memory (RRAM) cells, store data by switching between resistance states. For example, for binary data storage, a high-resistance state of the resistive memory cell may be read as logical "1," while a low-resistance state of the resistive memory cell may be read as logical "0." Switching between resistance states may be achieved by applying different physical signals (e.g., voltage, current, etc.) across the resistive memory cell to form, at least partially remove, or repair conductive filaments in a resistive memory element therein. Forming the conductive filaments can decrease the resistance of the memory cell, removing the conductive filaments can increase the resistance of the memory cell, and repairing the conductive filaments can decrease the resistance of the memory cell once again. Conventionally, the initial formation of the conductive filaments is referred to as "forming," the at least partial removal of the conductive filaments is referred to as "resetting," and the repair of the conductive filaments is referred to as "setting."

Oxide-based resistive memory cells, in particular, are attractive because of their simple structure and method of operation. In conventional oxide-based resistive memory cells, the resistive memory element includes a switchable resistance material, such as a dielectric metal oxide, between a first electrode and a second electrode. Conductive filaments in formed by removing oxygen atoms from the switchable resistance material to form oxygen vacancies therein. The conductive filaments can be reset by inserting oxygen atoms back into the switchable resistance material to fill the oxygen vacancies. The conductive filaments can be set by again removing oxygen atoms from the switchable resistance material to reform the oxygen vacancies. However, problems such as instability of operational parameters, poor yield, poor on/off resistance ratio, and unsatisfactory switching endurance resulting from deficiencies in conventional methods of forming resistive memory elements have limited the commercial potential of resistive memory cells and resistive memory cell devices.

It would, therefore, be desirable to have an improved method of forming resistive memory elements for resistive memory cells to overcome one or more of the above problems.

BRIEF DESCRIPTION OF THE SEVERAL VIEWS OF THE DRAWINGS

FIGS. 1A through 1D are cross-sectional views illustrating different process stages and structures for a method of forming a resistive memory element in accordance with embodiments of the present disclosure;

DETAILED DESCRIPTION

Figure 1A:
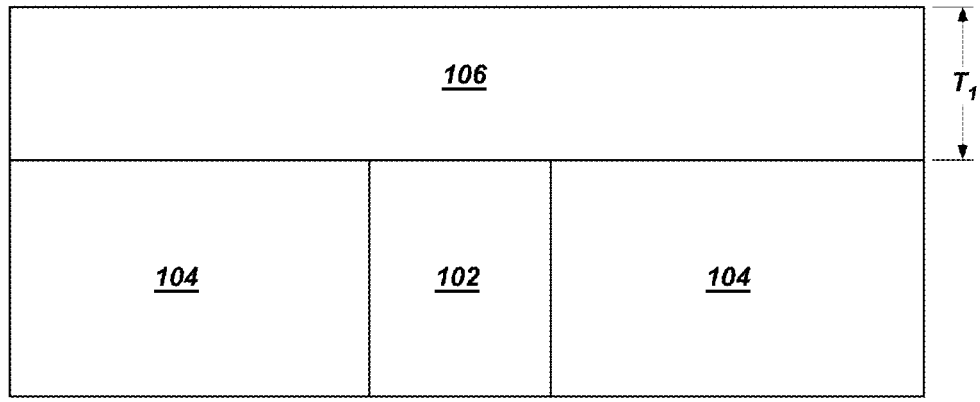

Methods of forming at least one resistive memory element, a resistive memory cell, and a resistive memory device are disclosed. In some embodiments, forming at least one resistive memory element includes forming an oxide material over a contact plug extending through an insulation material. The oxide material may be exposed to a plasma treatment process, such as a plasma process (e.g., a plasma nitridation process), to break chemical bonds between oxygen atoms and at least some other atoms of oxide material and form a treated oxide material. Dangling bonds resulting from plasma damage may be passivated during or after the plasma treatment process. A reactive material may be formed over the treated oxide material to getter oxygen from the treated oxide material. A capping material may be formed over the reactive material to form the at least one resistive memory element. By exposing the oxide material to the plasma treatment process, oxygen atoms may be more easily removed from and inserted into the treated oxide material during forming, reset, and set operations, facilitating high yield, a high on/off resistivity ratio, and excellent switching endurance as compared to conventional resistive memory cells.

The following description provides specific details, such as material types, material thicknesses, and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional fabrication techniques employed in the industry. In addition, the description provided herein does not form a complete process flow for forming a resistive memory cell, and each of the resistive memory elements, resistive memory cells, and resistive memory devices described below do not form a complete semiconductor device. Only those process acts and structures necessary to understand the embodiments of the present disclosure are described in detail below. Additional acts to form the complete semiconductor device may be performed by conventional fabrication techniques. Also note, any drawings accompanying the present application are for illustrative purposes only, and are thus not drawn to scale. Additionally, elements common between figures may retain the same numerical designation.

As used herein, the term "substrate" means and includes a base material or construction upon which additional materials are formed. The substrate may be a semiconductor substrate, a base semiconductor layer on a supporting structure, a metal electrode or a semiconductor substrate having one or more layers, structures or regions formed thereon. The substrate may be a conventional silicon substrate, or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, relational terms, such as "first," "second," "top," "bottom," "upper," "lower," "over," "under," etc., are used for clarity and convenience in understanding the disclosure and accompanying drawings and do not connote or depend on any specific preference, orientation, or order, except where the context clearly indicates otherwise.

As used herein, the term "yield" means and includes the number of memory cells that are validly programmable and erasable as a percentage of the total number of memory cells in a given batch. As used herein, the term "validly programmable" means and includes that correct logic is read for a particular physical signal (e.g., set voltage, reset voltage, etc.) applied to a memory cell.

As used herein, the term "on/off resistance ratio" means and includes the ratio between a resistance value at a time when a memory cell is in a low-resistivity state (ON state), and a resistance value at a time when the memory cell is in a high-resistivity state (OFF state).

As used herein, the term "switching endurance" means and includes the number of times a memory cell is able to be switched between resistance states before operability of the memory cell is compromised.

FIGS. 1A through 1D are simplified partial cross-sectional views illustrating embodiments of a method of forming at least one resistive memory element. With the description as provided below, it will be readily apparent to one of ordinary skill in the art that the methods described herein may be used in various applications. In other words, the methods of the present disclosure may be used whenever it is desired to enhance the switchable resistivity of a material through the removal and insertion of oxygen atoms.

Referring to FIG. 1A, an oxide material 106 may be formed on or over at least a first electrode 102. The first electrode 102, which may also be referred to as a contact plug, may extend through an electrically insulative material 104, such as a silicon nitride material. The first electrode 102 may be formed of and include an electrically conductive material including, but not limited to, a metal, a metal alloy, a conductive metal oxide, or combinations thereof. The first electrode 102 may be formed of, for example, an oxidation-resistant metal material, such as tungsten nitride (WN), titanium nitride (TiN), tantalum nitride (TaN), titanium aluminum nitride (TiAlN), platinum (Pt), iridium (Ir), iridium oxide ($IrO_x$), ruthenium (Ru), or ruthenium oxide ($RuO_x$). In at least some embodiments, the first electrode 102 includes TiN. The first electrode 102 may be in electrical contact with at least one of a conductive structure (not shown) and a semiconductive structure (not shown) in, on, or over a substrate (not shown). Each of the insulation material 104 and the first electrode 102 may be formed using conventional techniques and processing equipment, which are not described in detail herein.

The oxide material 106, which may also be referred to as a switchable resistivity material, may include an oxide dielectric material, such as a metal oxide dielectric material, formulated to be switched from one resistance state to another resistance state upon application of a physical signal (e.g., at least one of energy, voltage, current, or other physical phenomena). The oxide material 106 may be switchable from one resistance state to another resistance state, such as from a high-resistance state to a low-resistance state, upon application of a first physical signal, and may be switchable from the low-resistance state to the high-resistance state upon application of a second physical signal. As used herein, the term "metal" means and includes a refractory metal, an alkali metal, an alkaline earth metal, a transition metal, a post-transition metal, or a metalloid. If, for example, the oxide material 106 is a metal oxide dielectric material, a metal component of the oxide material 106 may at least one of chromium (Cr), cobalt (Co), hafnium (Hf), molybdenum (Mo), niobium (Nb), tantalum (Ta), titanium (Ti), tungsten (W), vanadium (V), zirconium (Zr), lanthanum (La), manganese (Mn), calcium (Ca), praseodymium (Pr), europium (Eu), silicon (Si), germanium (Ge), aluminum (Al), and nickel (Ni). By way of non-limiting example, the oxide material 106 may be at least one of silicon dioxide ($SiO_2$), a hafnium oxide ($HfO_x$), a hafnium silicon oxide ($HfSi_yO_x$), a zirconium oxide ($ZrO_x$), a zirconium silicon oxide ($ZrSi_yO_x$), a titanium oxide ($TiO_x$), a titanium silicon oxide ($TiSi_yO_x$), a tantalum oxide ($TaO_x$), a tantalum silicon oxide ($TaSi_yO_x$), a niobium oxide ($NbO_x$), a niobium silicon oxide ($NbSi_yO_x$), a vanadium oxide ($VO_x$), a vanadium silicon oxide ($VSi_yO_x$), a tungsten oxide ($WO_x$), a tungsten silicon oxide ($WSi_yO_x$), a molybdenum oxide ($MoO_x$), a molybdenum silicon oxide ($MoSi_yO_x$), a chromium oxide ($CrO_x$), and a chromium silicon oxide ($CrSi_yO_x$). In at least some embodiments, the oxide material 106 is $HfSi_yO_x$. Formulae including at least one of "x" and "y" above (e.g., $HfO_x$, $HfSi_yO_x$, $ZrO_x$, $ZrSi_yO_x$, $TiO_x$, $TiSi_yO_x$, etc.) represent a composite material that on average contains x atoms of oxygen and y atoms of silicon for every one atom of the metal component. As the formulae are representative of relative atomic ratios and not strict chemical structure, the oxide material 106 may be a stoichiometric compound or a non-stoichiometric compound, and values of x and y may be integers or may be non-integers. As used herein, the term "non-stoichiometric compound" means and includes a chemical compound with an elemental composition that cannot be represented by a ratio of well-defined natural numbers and is in violation of the law of definite proportions. If, for example, the oxide material 106 includes silicon, a ratio of metal atoms to silicon atoms in the oxide material 106 may be within a range of from about 200:1 to about 1:200, such as from about 8:1 to about 3:1.

The oxide material 106 may be selected at least partially based on a number of oxygen vacancies expected to be formed in the oxide material 106 following additional processing (e.g., plasma treatment, exposure to a reactive material, etc.), as described in further detail below. In one or more embodiments, the oxide material 106 may be a material that exhibits a comparatively larger number of oxygen vacancies when subjected to the additional processing (e.g., $SiO_2$, $HfO_x$, $ZrO_x$, $TiO_x$, $TaO_x$, $NbO_x$, $VO_x$, $WO_x$, $MoO_x$, or $CrO_x$). In additional embodiments, the oxide material 106 may be a material that exhibits a comparatively smaller number of oxygen vacancies (i.e., a smaller ratio of metal atoms to oxygen atoms) when subjected to the additional processing (e.g., $HfSi_yO_x$, $ZrSi_yO_x$, $TiSi_yO_x$, $TaSi_yO_x$, $NbSi_yO_x$, $VSi_yO_x$, $WSi_yO_x$, $MoSi_yO_x$, or $CrSi_yO_x$).

The oxide material 106 may have any suitable thickness. By way of non-limiting example, a thickness $T_1$ of the oxide material 106 may be within a range of from about 5 Angstroms (Å) to about 200 Å, such as from about 10 Å to about 100 Å, or from about 20 Å to about 80 Å. In at least some embodiments, the thickness $T_1$ of the oxide material 106 is about 50 Å.

The oxide material 106 may be formed on or over at least the first electrode 102 using conventional techniques, such as physical vapor deposition ("PVD"), chemical vapor deposition ("CVD"), or atomic layer deposition ("ALD"). PVD includes, but is not limited to, sputtering, evaporation, or ionized PVD. Such deposition techniques are known in the art and, therefore, are not described in detail herein.

Figure 1B:
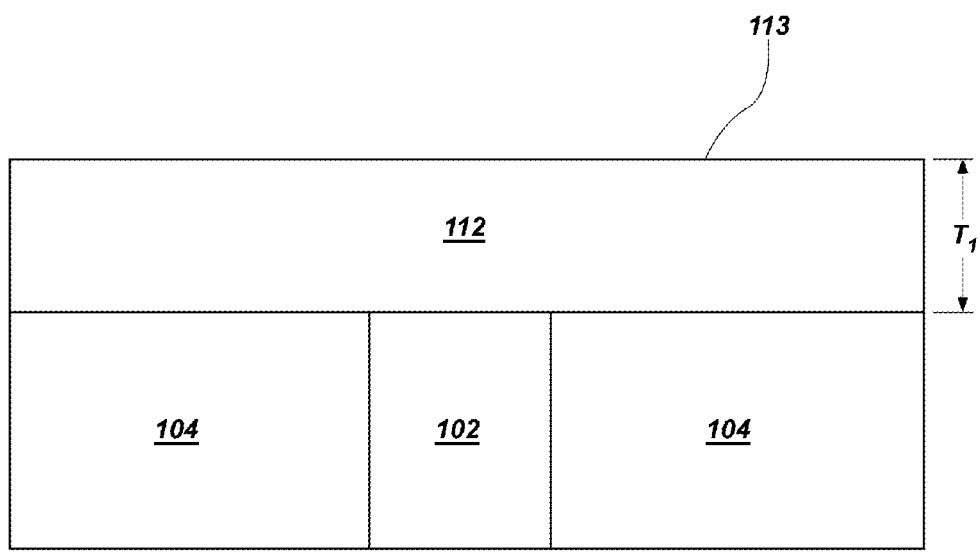

Referring to FIG. 1B, the oxide material 106 (FIG. 1A) may be subjected to a plasma nitridation process, such as a decoupled plasma nitridation (DPN) process, to damage and passivate the oxide material 106 and form a treated oxide material 112. The plasma nitridation process may simultaneously break chemical bonds between oxygen atoms and other atoms of the oxide material 106 while implanting nitrogen atoms into the lattice. Passivation of dangling bonds may also occur simultaneously. If, for example, the oxide material 106 is $SiO_2$, $HfO_x$, $HfSi_yO_x$, $ZrO_x$, $ZrSiO_x$, $TiO_x$, $TiSi_yO_x$, $TaO_x$, $TaSi_yO_x$, $NbO_x$, $NbSi_yO_x$, $VO_x$, $VSi_yO_x$, $WO_x$, $WSi_yO_x$, $MoO_x$, $MoSi_yO_x$, $CrO_x$, or $CrSi_yO_x$, at least a portion of the treated oxide material 112 may include a hafnium oxy-nitride ($HfO_xN_m$), a hafnium silicon oxy-nitride ($HfSi_yO_xN_m$), a zirconium oxy-nitride ($ZrO_xN_m$), a zirconium silicon oxy-nitride ($ZrSi_yO_xN_m$), a titanium oxy-nitride ($TiO_xN_m$), a titanium silicon oxy-nitride ($TiSi_yO_xN_m$), a tantalum oxy-nitride ($TaO_xN_m$), a tantalum silicon oxy-nitride ($TaSi_yO_xN_m$), a niobium oxy-nitride ($NbO_xN_m$), a niobium silicon oxy-nitride ($NbSi_yO_xN_m$), a vanadium oxy-nitride ($VO_xN_m$), a vanadium silicon oxy-nitride ($VSi_yO_xN_m$), a tungsten oxy-nitride ($WO_xN_m$), a tungsten silicon oxy-nitride ($WSi_yO_xN_m$), a molybdenum oxy-nitride ($MoO_xN_m$), a molybdenum silicon oxy-nitride ($MoSi_yO_xN_m$), a chromium oxy-nitride ($CrO_xN_m$), and a chromium silicon oxy-nitride ($CrSi_yO_xN_m$), respectively. Formulae including at least one of "y," "x," and "m" above (e.g., $HfO_xN_m$, $HfSi_yO_xN_m$, $ZrO_zN_m$, $ZrSi_yO_xN_m$, $TiO_xN_m$, $TiSi_yO_xN_m$, etc.) represent a composite material that, on average, contains x atoms of oxygen, y atoms of silicon, and m atoms of nitrogen for every one atom of the metal component. The treated oxide material 112 may be a stoichiometric compound or a non-stoichiometric compound, and values of y, x, and m may be integers or may be non-integers. The values of y, x, and m and may at least partially depend on the metal (e.g., Hf, Zr, Ti, Ta, Nb, V, W, Mo, Cr, etc.) used in the oxide material 106.

In one or more embodiments, the plasma used in the plasma nitridation process may include at least one non-nitrogen component. By way of non-limiting example, the plasma may include nitrogen and at least one dopant component (e.g., boron, oxygen, carbon, arsenic, silicon, germanium, etc.). If, for example, the plasma includes a dopant component, the dopant component and nitrogen may be provided as single chemical species (e.g., a compound including dopant component atoms and nitrogen atoms), or may be provided as different chemical species (e.g., a first chemical species including dopant component atoms and a separate chemical species including nitrogen atoms). In at least some embodiments, non-nitrogen components are substantially absent from the plasma used in the plasma nitridation process.

The treated oxide material 112 may include nitrogen up to the thickness $T_1$ of the treated oxide material 112. By way of non-limiting example, if the thickness $T_1$ of the treated oxide material 112 is about 50 Å, nitrogen may be included to a depth within a range of from about 1 Å to about 50 Å, such from about 1 Å to about 20 Å, from an exposed surface 113 of the treated oxide material 112. In one or more embodiments, the treated oxide material 112 includes nitrogen to a depth less than the thickness $T_1$ of the treated oxide material 112. In additional embodiments, nitrogen may be substantially limited to a location proximate the exposed surface 113 of the treated oxide material 112. A concentration of nitrogen throughout the thickness $T_1$ of the treated oxide material 112 may be varied from about 0 atomic percent to about 80 atomic percent. The concentration of nitrogen may vary throughout the thickness $T_1$ of the treated oxide material 112. By way of non-limiting example, the concentration of nitrogen throughout the thickness $T_1$ may decrease, may increase, may decrease and then increase, or may increase and then decrease in a direction extending away from the exposed surface 113 of the treated oxide material 112. Nitrogen may have, for example, a linear concentration distribution, a stepwise concentration distribution, or a Gaussian concentration distribution throughout the thickness $T_1$ of the treated oxide material 112.

The depth of nitrogen penetration and the concentration of nitrogen throughout the thickness $T_1$ of the treated oxide material 112 may be controlled and may be a function of a power applied during the plasma nitridation process and a duration of the plasma nitridation process. For example, an increase in the power applied during the plasma nitridation process may increase the depth of nitrogen penetration into the oxide material 106 (FIG. 1A), and an increase in the duration of the plasma nitridation process may increase the concentration of nitrogen throughout the depth. A power applied during the plasma nitridation process (e.g., DPN process) may be within a range of from about 200 watts (W) to about 2500 W, such as from about 400 W to about 2000 W, or from about 800 W to about 2000 W. In addition, a duration of the plasma nitridation process may be within a range of from about 10 seconds to about 300 seconds, such as from about 30 seconds to about 240 seconds, or from about 30 seconds to about 180 seconds. In at least some embodiments, the power applied during the plasma nitridation process is about 800 W and the duration of the plasma nitridation process is about 60 seconds.

The plasma nitridation process may be performed without performing an annealing process (e.g., a thermal anneal) prior to further processing. Conventionally, an annealing process is used to repair damage (e.g., broken bonds) to the structure subjected to the plasma nitridation process before performing additional processing. Omitting such an annealing process may maintain at least some damage to the treated oxide material 112, facilitating enhanced oxygen atom removal from the treated oxide material 112 during subsequent processing, as described in further detail below. In further embodiments, such as where at least some repair to the treated oxide material 112 is desirable, an annealing process may be employed prior to performing additional processing. The treated oxide material 112 may be damaged up to the thickness $T_1$ of the treated oxide material 112. By way of non-limiting example, if the thickness $T_1$ of the treated oxide material 112 is about 50 Å, the treated oxide material 112 may be damaged to a depth within a range of from about 1 Å to about 50 Å from the exposed surface 114 of the treated oxide material 112.

In additional embodiments, the oxide material 106 (FIG. 1A) may be subjected to a plasma treatment process other than a plasma nitridation process. By way of non-limiting example, the oxide material 106 may be exposed to a plasma including elements other than nitrogen, such as at least one element selected from the group consisting of hydrogen, deuterium, noble gas elements (e.g., argon, krypton, xenon, etc.), other non-metal elements (e.g., phosphorus, etc.), and metalloid elements (e.g., boron, arsenic, tellurium, etc.). The at least one element and conditions for generating and maintaining the plasma (e.g., temperature, pressure, power, duration, etc.) may be selected based on at least one of a desired depth of penetration into the oxide material 106, a desired concentration of the at least one element, and a desired amount of plasma damage to the oxide material 106. As the oxide material 106 is bombarded with the plasma, chemical bonds between oxygen atoms and other atoms of the oxide material 106 may be broken. The plasma treatment process may substantially simultaneously break chemical bonds of the oxide material 106 and passivate dangling bonds, or the plasma treatment process may break chemical bonds of the oxide material 106 without substantially simultaneously passivating dangling bonds. If, for example, the plasma treatment process does not substantially simultaneously passivate dangling bonds, the treated oxide material 112 may be subsequently exposed to at least one passivation material (e.g., hydrogen, nitrogen, fluorine, deuterium, etc.) to passivate at least some dangling bonds, or the treated oxide material 112 may be left substantially unpassivated such that dangling bonds substantially remain in the treated oxide material 112.

Referring to FIG. 1C, a second electrode 114 may be formed on or over the treated oxide material 112 to form a resistive memory element 120 including the first electrode 102, the treated oxide material 112, and the second electrode 114. The second electrode 114 may include a reactive material 116 and a capping material 118. The reactive material 116 may be formed on or over the treated oxide material 112, and the capping material 118 may be formed on or over the reactive material 116. The reactive material 116, which may also be referred to as a gettering material, may be any material formulated to remove or getter oxygen atoms from the treated oxide material 112. The reactive material 116 may, for example, facilitate the breaking of chemical bonds between oxygen atoms and other atoms of the treated oxide material 112, and may facilitate the migration of unbonded oxygen atoms from the treated oxide material 112 into the reactive material 116. As a non-limiting example, the reactive material 116 may be a metal included in the treated oxide material 112, or may be a metal not included in the treated oxide material 112. If, for example, the treated oxide material 112 includes Hf (e.g., $HfO_x$, $HfSi_yO_x$, $HfO_xN_m$, $HfSi_yO_xN_m$, etc.), Zr (e.g., $ZrO_x$, $ZrSi_yO_x$, $ZrO_xN_m$, $ZrSi_yO_xN_m$, etc.), Ti (e.g., $TiO_x$, $TiSi_yO_x$, $TiO_xN_m$, $TiSi_yO_xN_m$, etc.), Ta (e.g., $TaO_x$, $TaSi_yO_x$, $TaO_xN_m$, $TaSi_yO_xN_m$), Nb ($NbO_x$, $NbSi_yO_x$, $NbO_xN_m$, $NbSi_y$-$O_xN_m$, etc.), V ($VO_x$, $VSi_yO_x$, $VO_xN_m$, $VSi_yO_xN_m$), W ($WO_x$, $WSi_yO_x$, $WO_xN_m$, $WSi_yO_xN_m$, etc.), Mo ($MoO_x$, $MoSi_yO_x$, $MoO_xN_m$, $MoSi_yO_xN_m$, etc.), or Cr (e.g., $CrO_x$, $CrSi_yO_x$, $CrO_xN_m$, $CrSi_yO_xN_m$, etc.), the reactive material 116 may be Hf, Zr, Ti, Ta, Nb, V, W, Mo, or Cr. In at least some embodiments, the reactive material 116 is Ti.

A thickness $T_2$ of the reactive material 116 may be selected at least partially based on the thickness $T_1$ of the treated oxide material 112 and the ease of oxygen removal from the treated oxide material 112 (e.g., as facilitated through the plasma nitridation process, or another process). The thickness $T_2$ of the reactive material 116 may be selected such that neither too little oxygen nor too much oxygen is removed from the treated oxide material 112 by the reactive material 116. As a non-limiting example, thickness $T_2$ of the reactive material 116 may be less than or equal to the thickness $T_1$ of the treated oxide material 112, such as within a range of from about 10 Angstroms up to the thickness $T_1$ of the treated oxide material 112.

The reactive material 116 may be formed on or over the treated oxide material 112 shortly after the formation of the treated oxide material 112 to substantially limit a loss of oxygen atoms to the environment surrounding the treated oxide material 112 and enhance the amount of oxygen atoms gettered into the reactive material 116. The reactive material 116 may be formed on or over the treated oxide material 112 using known methods, such as PVD, CVD, or ALD, which are not described in detail herein. In at least some embodiments, the reactive material 116 is formed using PVD.

The capping material 118 may be formed of and include any suitable conductive material including, but not limited to, a metal, a metal alloy, a conductive metal oxide, or combinations thereof. The capping material 118 may substantially limit or prevent the reactive material 116 from reacting with ambient oxygen (i.e., oxygen atoms other than those gettered from the treated oxide material 112). The capping material 118 may be, for example, an oxidation-resistant metal material, such as WN, TiN, TaN, TiAlN, Pt, Ir, $IrO_x$, Ru, or $RuO_x$. The capping material 118 may be substantially the same as or may be different than a material of the first electrode 102. In at least some embodiments, the capping material 118 is WN. The capping material 118 may be formed shortly after the formation of the reactive material 116 to substantially limit or prevent the reactive material 116 from reacting with ambient oxygen. The capping material 118 may be formed on the reactive material 116 using known techniques, such as PVD, CVD, or ALD, which are not described in detail herein.

Accordingly, a method of fondling a resistive memory element may comprise forming a switchable resistivity material over a contact plug extending through an insulation material. The switchable resistivity material may be exposed to a plasma treatment process to break chemical bonds between oxygen atoms and other atoms of the switchable resistivity material. A reactive material may be formed on the switchable resistivity material without annealing the switchable resistivity material. A capping material may be formed over the reactive material.

In addition, another method of forming a resistive memory element may comprise forming an oxide material over a first electrode. The oxide material may be exposed to a plasma process to form a treated oxide material. A second electrode may be formed on the treated oxide material.

Figure 1D:
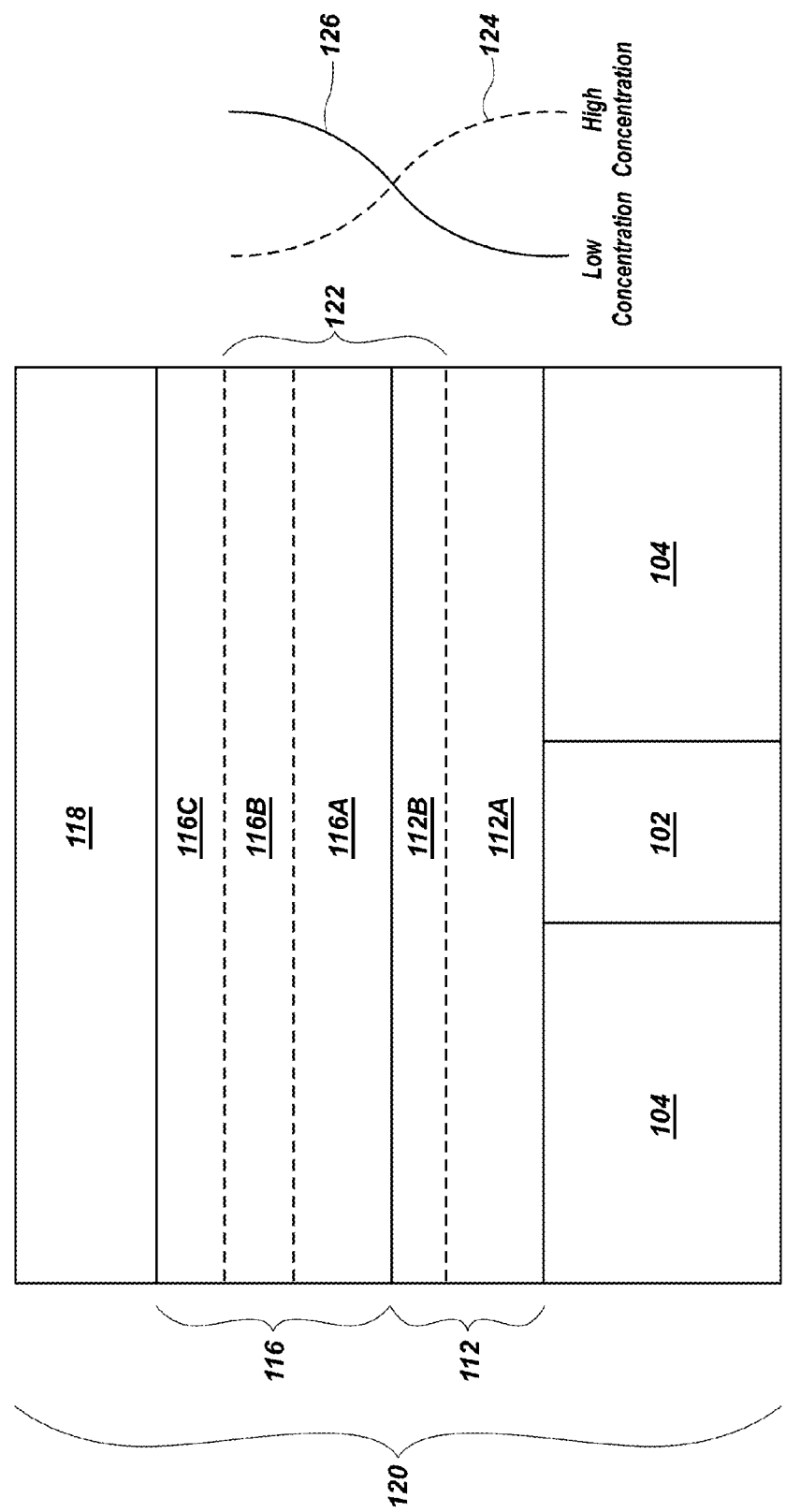

Referring to FIG. 1D, forming the reactive material 116 on the treated oxide material 112 enables oxygen atoms to migrate from the treated oxide material 112 into the reactive material 116. The migration of the oxygen atoms may, for example, form an oxygen-deficient region 112B and a remaining region 112A in the treated oxide material 112. The oxygen-deficient region 112B may have a lower oxygen concentration than before the removal of the oxygen atoms, and the remaining region 112A may have a substantially similar oxygen concentration as compared to before the removal of the oxygen atoms. In addition, the migration of the oxygen atoms may, for example, form an insulative oxygen-deficient region 116A, a conductive oxygen-deficient region 116B, and an unreacted region 116C in the reactive material 116. Each of the insulative oxygen-deficient region 116A and the conductive oxygen-deficient region 116B may have an oxygen concentration greater than before the removal of the oxygen atoms from the treated oxide material 112, and the unreacted region 116C may have a substantially similar oxygen concentration as compared to before the removal of the oxygen atoms from the treated oxide material 112. As of formation, the insulative oxygen-deficient region 116A may be electrically insulative and may have a greater oxygen concentration than the conductive oxygen-deficient region 116B, which may be electrically conductive. As shown in FIG. 1D, the oxygen-deficient region 112B may be located over the remaining region 112A, the insulative oxygen-deficient region 116A may be located over the oxygen-deficient region 112B, the conductive oxygen-deficient region 116B may be located over the insulative oxygen-deficient region 116A, and the unreacted region 116C may be located over the conductive oxygen-deficient region 116B. In additional embodiments, the unreacted region 116C of the reactive material 116 may be substantially absent (i.e., substantially all of the reactive material 116 may be oxidized by oxygen gettered from the treated oxide material 112). A reactive region 122 may include the conductive oxygen-deficient region 112B of the treated oxide material 112, the insulative oxygen-deficient region 116A of the reactive material 116, and the conductive oxygen-deficient region 116B of the reactive material 116. Oxygen atoms may shift locations in the reactive region 122 during forming, resetting, and setting operations, as described in further detail below.

Accordingly, a resistive memory element of the present disclosure may comprise a contact plug extending through a insulation material and comprising an oxidation-resistant material, a treated oxide material over the contact plug and comprising an oxygen-deficient oxide material and an oxynitride material, a reactive material over the treated oxide material and comprising metal, and a capping material over the reactive material and comprising another oxidation-resistant material.

In one or more embodiments, an annealing process (e.g., a thermal anneal) may be used to increase the migration of oxygen atoms from the treated oxide material 112 into the reactive material 116. The annealing process may, for example, enhance the breaking of bonds between oxygen atoms and other atoms of the treated oxide material 112. In additional embodiments, the plasma treatment process previously described above (e.g., the plasma nitridation process) may facilitate sufficient oxygen atom removal from the treated oxide material 112 so that the annealing process may be omitted.

An oxygen concentration profile throughout each of the treated oxide material 112 and the reactive material 116 upon the initial removal of the oxygen atoms from the treated oxide material 112 is illustrated by the graphic representation 124 on the right side of FIG. 1D. As shown in FIG. 1D, oxygen concentration may be highest in the remaining region 112A of the treated oxide material 112 and may decrease heading in the direction of the capping material 118 (i.e., the oxygen concentration may decrease across the oxygen-deficient region 112B, the insulative oxygen-deficient region 116A, the conductive oxygen-deficient region 116B, and the unreacted region 116C). Conversely, an oxygen vacancy profile throughout the treated oxide material 112 and the reactive material 116 upon the initial removal of the oxygen atoms from the treated oxide material 112 is illustrated by the graphic representation 126 on the right side of FIG. 1D. As shown in 1D, the oxygen vacancy profile may be substantially inversely proportional to the oxygen concentration. Put another way, the number of oxygen vacancies may be lowest in the remaining region 112A of the treated oxide material 112 and may increase heading in the direction of the capping material 118.

Following the migration of oxygen atoms from the treated oxide material 112 into the reactive material 116, the resistive memory element 120 may be subjected to additional processing. By way of non-limiting example, the resistive memory element 120 may be patterned, etched, and passivated. Such additional processing may be performed using conventional techniques and processing equipment, which are not described in detail herein.

Figure 2:
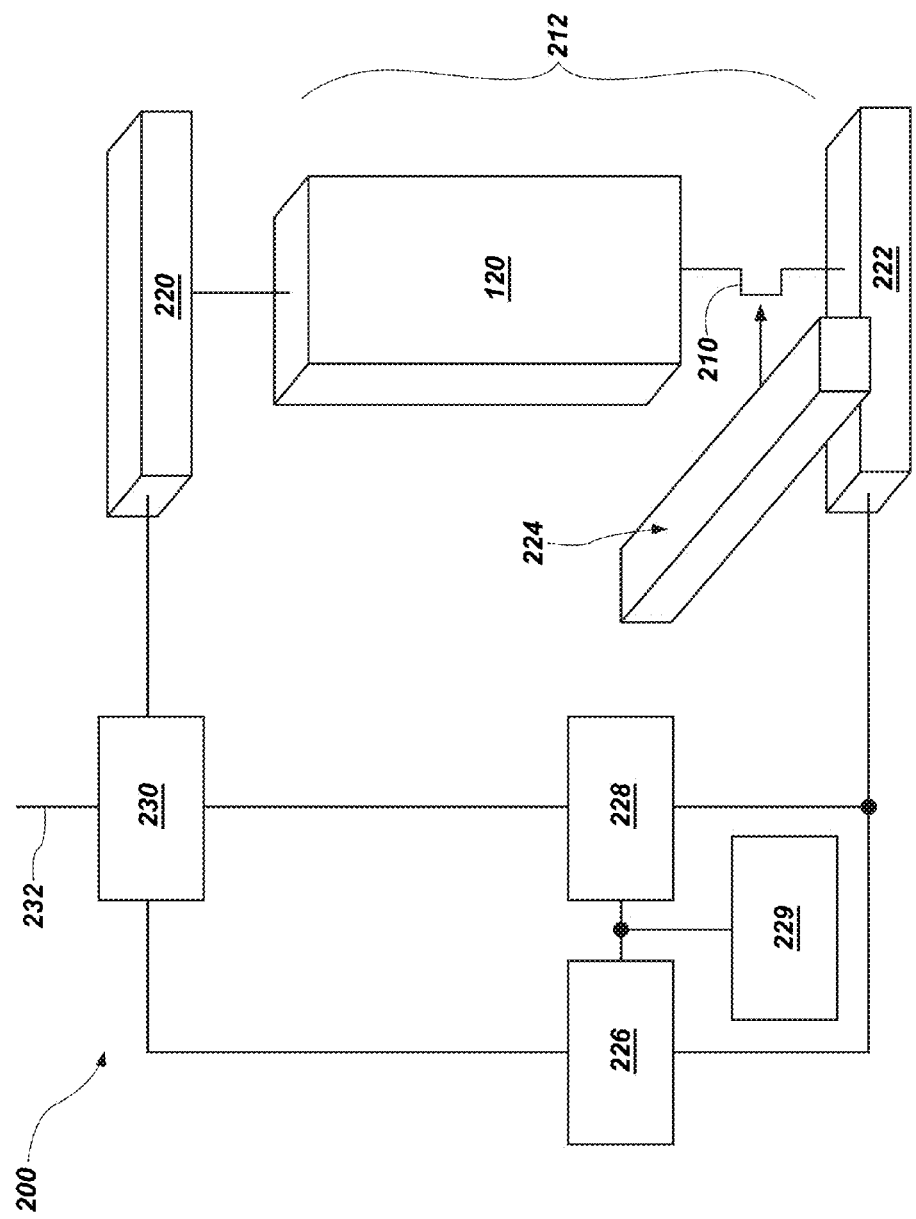
FIG. 2 is a functional block diagram of a resistive memory device in accordance with embodiments of the present disclosure.

FIG. 2 illustrates a functional block diagram of a reactive memory device 200 in accordance with an embodiment of the present disclosure. The resistive memory device 200 may include at least one resistive memory cell 212 between at least one data/sense line, for example, a bit line 220, and at least one source line 222. The resistive memory cell 212 may include an access device 210 coupled or connected in series with the resistive memory element 120 previously described above. The access device 210 may act as a switch for enabling and disabling current flow through the resistive memory element 120. By way of non-limiting example, the access device 210 may be a transistor (e.g., a field-effect transistor, a bipolar junction transistor, etc.) with a gate (not shown) connected to an access line, for example, a word line 224. The word line 224 may extend in a direction substantially perpendicular to that of the bit line 220. The bit line 220 and the source line 222 may be connected to logic for programming and reading the resistive memory element 120. A control multiplexer 230 may have an output connected to the bit line 220. The control multiplexer 230 may be controlled by a control logic line 232 to select between a first input connected to a pulse generator 226, and a second input connection to read-sensing logic 228.

Accordingly, a resistive memory cell of the present disclosure may comprise an access device and a resistive memory element coupled to the access device. The resistive memory element may comprise a first electrode, a treated oxide material on the first electrode and comprising an oxygen-deficient oxide material and an oxy-nitride material, and a second electrode on the treated oxide material.

In addition, a resistive memory device of the present disclosure may comprise a word line, a bit line, a source line, and a resistive memory cell between the bit line and the source line. The resistive memory cell may comprise an access device coupled to the word line, and a resistive memory element between to the access device and the bit line. The resistive memory element may comprise a first electrode, a second electrode and a treated oxide material between the first electrode and the second electrode, the treated oxide material comprising an oxygen-deficient oxide material and an oxy-nitride material.

During a programming operation, a voltage greater than a threshold voltage of the access device 210 may be applied to the word line 224 to turn on the access device 210. Turning on the access device 210 completes a circuit between the source line 222 and the bit line 220 by way of the resistive memory element 120. After turning on the access device 210, a bias generator 229 may establish, by way of the pulse generator 226, a bias voltage potential difference between the bit line 220 and the source line 222. Referring to FIG. 1D, if a forming bias voltage or a set bias voltage is established, oxygen atoms migrate from the treated oxide material 112 into the reactive material 116 (e.g., the insulative oxygen-deficient region 116A, and the conductive oxygen-deficient region 116B) to form oxygen-vacancy-based conductive filaments in at least the treated oxide material 112. The oxygen-vacancy-based conductive filaments reduce the resistivity of the resistive memory element 120. Conversely, if a reset bias voltage is established, oxygen atoms migrate from the reactive material 116 back into the treated oxide material 112 to remove the oxygen-vacancy-based conductive filaments therein and increase the resistivity of the resistive memory element 120.

Referring again to FIG. 2, during a read operation, the bias generator 229 may establish, by way of read-sensing logic 228, a read bias voltage potential difference between the bit line 220 and the source line 222. The read bias voltage may be lower than the reset bias voltage. The read bias voltage enables current to flow through the resistive memory element 120 according a resistance state of the treated oxide material 112 (FIG. 1D). For example, for a given read bias voltage, if the treated oxide material 112 is in a high-resistance state (e.g., a reset state), a relatively smaller current flows through the resistive memory element 120 than if the treated oxide material 112 is in a low-resistance state (e.g., a set state). The amount of current flowing through resistive memory element 120 during the read operation may be compared to a reference input by the read-sensing logic 228 (e.g., a sense amplifier) to discriminate whether the data stored in the resistive memory cell 212 is a logic "1" or a logic "0."

The methods and structures of the present disclosure may advantageously improve resistive memory performance as compared to conventional methods and structures. For example, the plasma nitridation processing described herein may increase migration of oxygen atoms in the resistive memory element (e.g., by breaking O—R bonds, where R is an atom of another element, to enable easier oxygen atom removal by a resistive material) and increase oxygen availability (e.g., by replacing at least some O—R bonds with N—R bonds). The increased oxygen atom availability and migration may, in turn, facilitate high yield (e.g., greater than or equal to 99%), a high on/off resistance ratio (e.g., greater than or equal to 100), and excellent switching endurance (e.g., greater than or equal to $10^6$ cycles). The methods and structures of the present disclosure may also facilitate low operation currents, fast switching speed, reliable data retention, and excellent scalability.

The following example serves to explain some embodiments of the present disclosure in more detail. The example is not to be construed as being exhaustive or exclusive as to the scope of the disclosure.

EXAMPLE

Figure 3A:
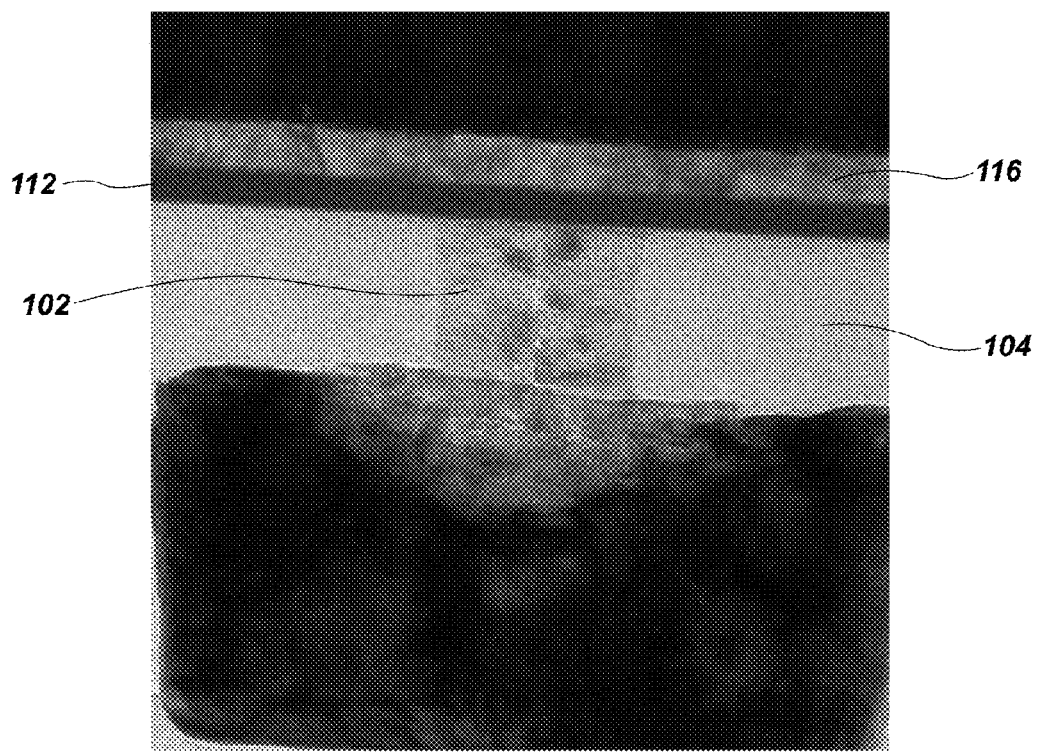
FIG. 3A is a transmission electron micrograph (TEM) showing a partial cross-sectional view of a resistive memory element, as described in Example 1.

A number of sample RRAM devices, each including one hundred RRAM elements formed by different methods, were analyzed. To form the RRAM elements of each device, $HfSi_yO_x$ (Hf:Si ratio of 8:1 or 3:1) was formed on TiN. For some of the sample devices, after forming the $HfSi_yO_x$, the $HfSi_yO_x$ was exposed to at least one of a DPN process and a thermal anneal at 600° C. If utilized, the DPN process employed a power of 800 W, 1200 W, or 2000 W and a duration of 30 seconds. Ti was deposited on the $HfSi_yO_x$ (whether nitrided or unnitrided), and WN was deposited on the Ti. FIG. 3A is a transmission electron micrograph (TEM) showing a partial cross-sectional view an RRAM element that was formed for one of the sample RRAM devices. The sample RRAM devices were finalized for testing using conventional processes (e.g., masking, etching, passivation).

Upon formation of the sample RRAM devices, each sample RRAM device was switched between a low-resistivity state ("LRS") and a high-resistivity state ("HRS") ten times and then subjected to yield analysis and on/off resistance analysis. Table 1 below briefly summarizes the RRAM element formation details and yield results of some of the sample RRAM devices. The results indicate that, for at least some switchable resistivity materials, employing DPN without a thermal anneal facilitates an improvement in yield, as compared to either not performing DPN (i.e., whether or not a thermal anneal is also performed) or performing DPN with a thermal anneal. The results also indicate that for at least some switchable resistivity materials, increasing the power applied during DPN may facilitate an improvement in yield.

TABLE 1

Sample Data

| Sample | Ratio Hf:Si | DPN (Power Applied) | Thermal Anneal (Temperature) | Yield |
|---|---|---|---|---|
| 1 | 8:1 | No | No | 58% |
| 3 | 8:1 | No | Yes (600° C.) | 53% |
| 4 | 8:1 | Yes (800 W) | Yes (600° C.) | 12% |
| 7 | 8:1 | Yes (800 W) | No | 82% |
| 8 | 8:1 | Yes (1200 W) | No | 74% |
| 9 | 8:1 | Yes (2000 W) | No | 90% |
| 10 | 3:1 | No | No | 90% |
| 21 | 3:1 | Yes (800 W) | No | 96% |

Figure 3B:
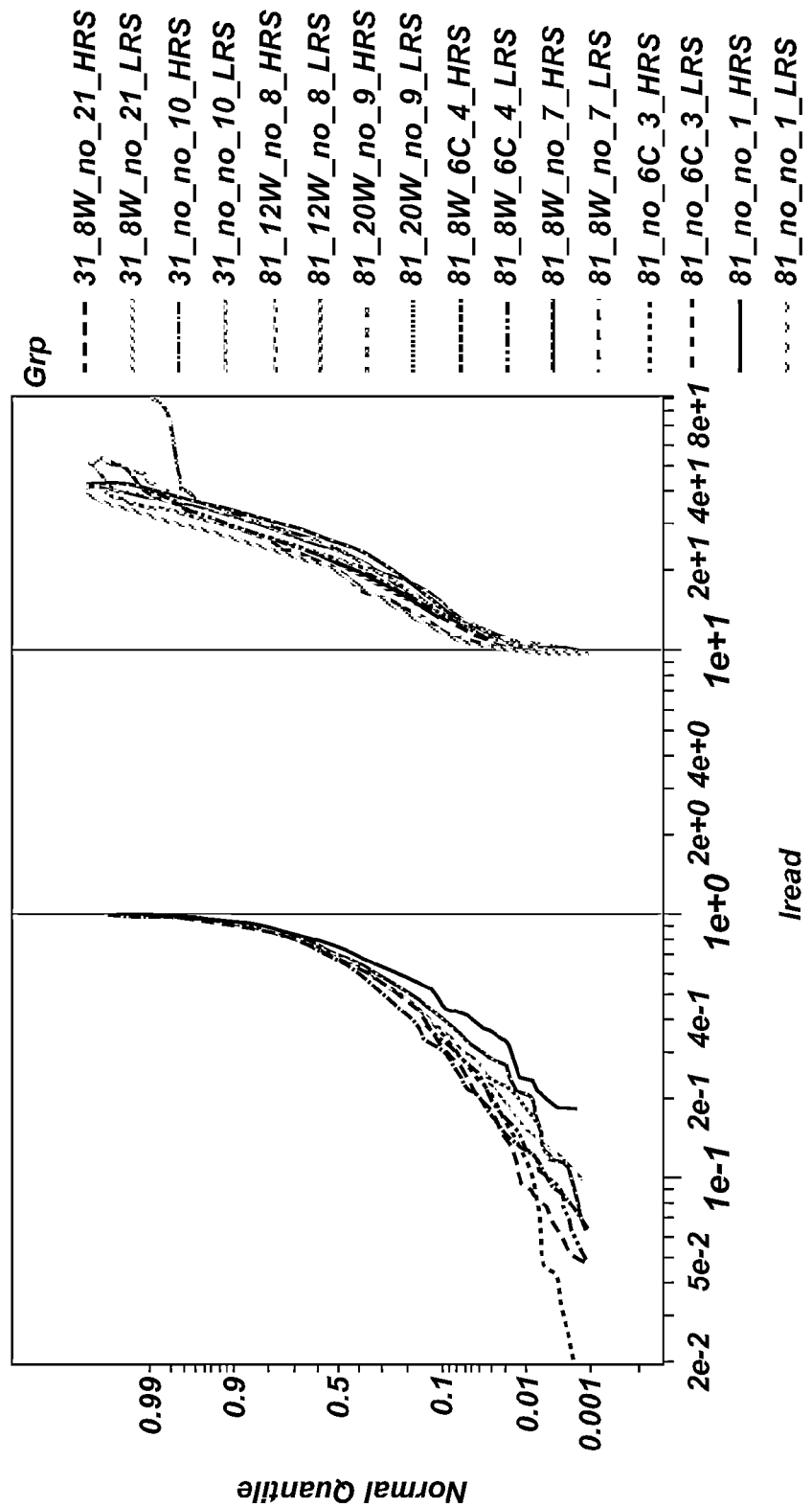
FIG. 3B is a graph illustrating a low-resistance state and a high-resistance state for a variety of resistive memory devices formed using embodiments of the method of the present disclosure, as described in Example 1.

FIG. 3B provides a graph illustrating a LRS (i.e., to the right of $I_{read}$=10 µA) and a HRS (to the left of $I_{read}$=1 µA) of the sample RRAM devices summarized in Table 1. In FIG. 3B, the sample RRAM device number (e.g., 1, 3, 4, 7, 8, 9, 10, and 21) is provided adjacent "_LRS" or "_HRS" in the legend. The results depicted in FIG. 3B indicate that decoupled plasma nitridation of the $HfSi_yO_x$ material facilitated tail bits extending farther into the HRS, enabling a deeper reset (i.e., a $HfSi_yO_x$ resistivity closer to the resistivity of the $HfSi_yO_x$ prior to DPN and the formation of the Ti thereon) and, hence, a more discernable difference between OFF and ON states of the memory cells.

While the present disclosure is susceptible to various modifications and alternative forms, specific embodiments have been shown by way of example in the drawings and have been described in detail herein. However, the present disclosure is not intended to be limited to the particular forms disclosed. Rather, the present disclosure is to cover all modifications, equivalents, and alternatives falling within the scope of the present disclosure as defined by the following appended claims and their legal equivalents.

What is claimed is:

1. A resistive memory element, comprising:
   a contact plug extending through an insulation material and comprising an oxidation-resistant material;
   a treated oxide material over the contact plug and comprising an oxygen-deficient oxide material and an oxy-nitride material;
   a reactive material over the treated oxide material and comprising metal; and
   a capping material over the reactive material and comprising another oxidation-resistant material.

2. The resistive memory element of claim 1, wherein a concentration of nitrogen varies throughout a thickness of the treated oxide material.

3. The resistive memory element of claim 1, wherein the oxy-nitride material comprises at least one of a hafnium oxy-nitride, a hafnium silicon oxy-nitride, a zirconium oxy-nitride, a zirconium silicon oxy-nitride, a titanium oxy-nitride, a titanium silicon oxy-nitride, a tantalum oxy-nitride, a tantalum silicon oxy-nitride, a niobium oxy-nitride, a niobium silicon oxy-nitride, a vanadium oxy-nitride, a vanadium silicon oxy-nitride, a tungsten oxy-nitride, a tungsten silicon oxy-nitride, a molybdenum oxy-nitride, a molybdenum silicon oxy-nitride, a chromium oxy-nitride, and a chromium silicon oxy-nitride.

4. The resistive memory element of claim 1, wherein the treated oxide material comprises nitrogen up to a depth within a range of from about 1 Angstrom to about 50 Angstroms from a surface of the treated oxide material adjacent the reactive material.

5. The resistive memory element of claim 1, wherein the reactive material comprises:

an insulative titanium oxide material on the treated oxide material; and
a conductive titanium oxide material on the insulative titanium oxide material.

6. A resistive memory cell, comprising:
an access device; and
a resistive memory element coupled to the access device and comprising:
a first electrode;
a treated oxide material on the first electrode and comprising an oxygen-deficient oxide material and an oxy-nitride material; and
a second electrode on the treated oxide material.

7. A resistive memory device, comprising:
a word line;
a bit line;
a source line; and
a resistive memory cell between the bit line and the source line and comprising:
an access device coupled to the word line;
a resistive memory element between the access device and the bit line and comprising:
a first electrode;
a second electrode; and
a treated oxide material between the first electrode and the second electrode, the treated oxide material comprising an oxygen-deficient oxide material and an oxy-nitride material.

8. The resistive memory device of claim 7, wherein the second electrode comprises:
a reactive material on the treated oxide material and comprising hafnium, zirconium, titanium, tantalum, niobium, vanadium, molybdenum, or chromium; and
a capping material on the reactive material and comprising tungsten nitride, titanium nitride, tantalum nitride, titanium aluminum nitride, platinum, iridium, an iridium oxide, ruthenium, or a ruthenium oxide.

9. The resistive memory device of claim 8, wherein the first electrode and the capping material each comprise tungsten nitride.

10. The resistive memory device of claim 8, wherein the reactive material comprises:
an insulative region on the oxygen-deficient oxide material of the treated oxide material; and
a conductive region overlying the insulative region.

11. The resistive memory device of claim 10, wherein the reactive material further comprises an unreacted region between the conductive region and the second electrode.

12. The resistive memory device of claim 10, wherein the insulative region of the reactive material comprises a greater concentration of oxygen than the conductive region of the reactive material.

13. The resistive memory cell of claim 6, wherein the treated oxide material is substantially free of dangling bonds.

14. The resistive memory cell of claim 6, wherein the treated oxide material comprises at least some dangling bonds.

15. The resistive memory cell of claim 6, wherein the treated oxide material comprises:
a first region overlying the first electrode and comprising one or more of silicon dioxide, a hafnium oxide, a zirconium oxide, a titanium oxide, a tantalum oxide, a niobium oxide, a vanadium oxide, a tungsten oxide, a molybdenum oxide, and a chromium oxide;
a second region overlying the first region and comprising one or more of a hafnium oxy-nitride, a zirconium oxy-nitride, a titanium oxy-nitride, a tantalum oxy-nitride, a niobium oxy-nitride, a vanadium oxy-nitride, a tungsten oxy-nitride, a molybdenum oxy-nitride, and a chromium oxy-nitride.

16. The resistive memory cell of claim 6, wherein the treated oxide material comprises:
a first region overlying the first electrode and comprising one or more of a hafnium silicon oxide, a zirconium silicon oxide, a titanium silicon oxide, a tantalum silicon oxide, a niobium silicon oxide, a vanadium silicon oxide, a tungsten silicon oxide, a molybdenum silicon oxide, and a chromium silicon oxide;
a second region overlying the first region and comprising one or more of a hafnium silicon oxy-nitride, a zirconium silicon oxy-nitride, a titanium silicon oxy-nitride, a tantalum silicon oxy-nitride, a niobium silicon oxy-nitride, a vanadium silicon oxy-nitride, a tungsten silicon oxy-nitride, a molybdenum silicon oxy-nitride, and a chromium silicon oxy-nitride.

17. The resistive memory element of claim 1, wherein the treated oxide material comprises nitrogen to a depth less than a thickness of the treated oxide material.

18. The resistive memory element of claim 17, wherein the nitrogen is only present at a location proximate an upper surface of the treated oxide material.

19. The resistive memory element of claim 1, wherein the treated oxide material exhibits a linear concentration distribution of nitrogen, a stepwise concentration distribution of nitrogen, or a Gaussian concentration distribution of nitrogen.

20. The resistive memory element of claim 17, wherein a ratio of metal atoms to silicon atoms in at least a portion of the treated oxide material is within a range of from about 3:1 to about 8:1.

* * * * *